(12) United States Patent
Wu et al.

(10) Patent No.: US 7,583,484 B2
(45) Date of Patent: Sep. 1, 2009

(54) CIRCUIT AND METHOD FOR ESD PROTECTION

(75) Inventors: Yi-Hsun Wu, Hsin-Chu (TW); Jian-Hsing Lee, Hsin-chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 968 days.

(21) Appl. No.: 10/644,718

(22) Filed: Aug. 20, 2003

(65) Prior Publication Data

US 2005/0041346 A1    Feb. 24, 2005

(51) Int. Cl.
    *H02H 3/22*    (2006.01)
(52) U.S. Cl. .......................... 361/56; 361/111
(58) Field of Classification Search ............. 361/56–58, 361/91.1, 111
    See application file for complete search history.

(56) References Cited

U.S. PATENT DOCUMENTS

| | | |
|---|---|---|
| 3,947,778 A | 3/1976 | Hsiao |
| 5,179,297 A | 1/1993 | Hsueh et al. |
| 5,304,867 A | 4/1994 | Morris |
| 5,311,391 A * | 5/1994 | Dungan et al. ................. 361/56 |
| 5,381,062 A | 1/1995 | Morris |
| 5,418,476 A | 5/1995 | Strauss |
| 5,504,450 A | 4/1996 | McPartland |
| 5,548,241 A | 8/1996 | McClure |
| 5,576,656 A | 11/1996 | McClure |
| 5,581,209 A | 12/1996 | McClure |
| 5,589,794 A | 12/1996 | McClure |
| 5,594,373 A | 1/1997 | McClure |
| 5,596,297 A | 1/1997 | McClure et al. |
| 5,598,122 A | 1/1997 | McClure |
| 5,663,917 A | 9/1997 | Oka et al. |
| 5,808,480 A | 9/1998 | Morris |
| 5,864,243 A | 1/1999 | Chen et al. |
| 5,926,056 A | 7/1999 | Morris et al. |

(Continued)

FOREIGN PATENT DOCUMENTS

CN    1381885 A    11/2002

(Continued)

OTHER PUBLICATIONS

M. Pelgrom and E. Dijkmans, "A 3/5V compatible I/O Buffer," IEEE Journal of Solid-State Circuits, vol. 30, No. 7, Jul. 1995, pp. 823-825.

(Continued)

*Primary Examiner*—Danny Nguyen
(74) *Attorney, Agent, or Firm*—Duane Morris LLP

(57) ABSTRACT

A sensor for electrostatic discharge (ESD) protection includes a voltage divider and a device coupled thereto. The sensor is coupled to an input terminal of the sensor, wherein a voltage drop occurs across the voltage divider and a high state voltage is generated at an output terminal of the sensor when an ESD voltage pulse is applied to the input terminal of the sensor. The device maintains the high state voltage at the output terminal of the sensor, while the ESD voltage pulse is applied to the input terminal of the sensor. A method for ESD protection includes the step of pulling down a gate terminal of a MOS transistor of an ESD circuit to a low state voltage when an ESD pulse is sensed.

8 Claims, 3 Drawing Sheets

U.S. PATENT DOCUMENTS

| | | | |
|---|---|---|---|
| 5,933,027 | A | 8/1999 | Morris et al. |
| 5,952,848 | A | 9/1999 | Morris |
| 5,973,534 | A | 10/1999 | Singh |
| 6,014,298 | A * | 1/2000 | Yu .............................. 361/56 |
| 6,069,782 | A * | 5/2000 | Lien et al. ................... 361/111 |
| 6,268,993 | B1 * | 7/2001 | Anderson .................... 361/111 |
| 6,459,553 | B1 | 10/2002 | Drapkin et al. |
| 6,515,503 | B2 | 2/2003 | Griffin et al. |
| 6,775,112 | B1 * | 8/2004 | Smith et al. ................... 361/18 |
| 6,970,336 | B2 * | 11/2005 | Stockinger et al. ............ 361/56 |
| 2002/0014665 | A1 | 2/2002 | Lee et al. |
| 2002/0070751 | A1 | 6/2002 | Kunz et al. |
| 2002/0149029 | A1 | 10/2002 | Wu et al. |
| 2003/0107924 | A1 | 6/2003 | Mizuno et al. |

FOREIGN PATENT DOCUMENTS

| | | |
|---|---|---|
| TW | 444385 | 7/2001 |
| TW | 464058 | 11/2001 |

OTHER PUBLICATIONS

N. Otsuka and M. A. Horowitz,. "Circuit Techniques for 1.5-V Power Supply Flash Memory", IEEE Journal of Solid-State Circuits, vol. 32, No. 8, Aug. 1997, pp. 1217-1230.

G. Singh and R. Salem, "High-Voltage-Tolerant I/O Buffers with Low-Voltage CMOS Process," IEEE Journal of Solid-State Circuits, vol. 34, No. 11, Nov. 1999, pp. 1512-1525.

L. T. Clark, "A High-Voltage Output Buffer Fabricated on a 2V CMOS Technology," 1999 Symposium on VLSI Circuits Digest of Technical Papers, pp. 61-62.

Jian-Hsing Lee, J.R. Shih, Y.H. Wu, T.C. Ong, "The Failure Mechanism Of High Voltage Tolerance IO Buffer Under ESD," IEEE 03CH37400. 41st Annual International Reliability Physics Symposium, Dallas, Texas, 2003 (pp. 269-276) © 2003 IEEE.

Office Action dated Apr. 13, 2007 in corresponding Chinese Patent Application No. CN1381885A.

* cited by examiner

CIRCUIT AND METHOD FOR ESD PROTECTION

BACKGROUND OF THE INVENTION

1. Field of the Invention

The present invention relates to a circuit and method for protecting semiconductor integrated circuits. More particularly, the present invention relates to a circuit and a method for electrostatic discharge (ESD) protection within semiconductor integrated circuits.

2. Description of the Related Art

Because of high level integration of semiconductor integrated circuits, product reliabilities are more and more important for the circuits. One concern to the integrated circuits is the vulnerability to electrostatic damage (ESD). An ESD pulse occurs once the pins or input/output bond pads of the integrated circuits are charged with a high voltage or current resulting from a body or material that is statically charged. Usually the voltage charged is more than 100V and in a short period time about 10 to several hundred nanoseconds (ns). Due to the sharp but short voltage or current pulse, the internal devices of the integrated circuits cannot withstand the abnormal voltage drop and are frequently destroyed. Therefore, ESD protection circuits are designed and connected to input/output (I/O) pads and internal integrated circuits to provide an additional current path for bypassing the voltage or current pulse.

FIG. 1 illustrates a prior art ESD protection circuit. An I/O pad 100 is connected to an ESD protection circuit. The ESD protection circuit includes a P-type metal-oxide-semiconductor (PMOS) transistor 150 and a stacked NMOS (ST NMOS) transistor 110. The ST NMOS has been proposed and used for tolerating an ESD pulse in mixed-voltage I/O circuits. The ST NMOS transistor 110 includes a first NMOS transistor 130 and a second NMOS transistor. The gate terminal of the first NMOS transistor 130 is coupled to a Vcc terminal, and the gate terminal of the second NMOS transistor 140 is coupled to an output of a NMOS pre-driver circuit 160. The source terminal of the second NMOS transistor 140 is coupled to a Vss terminal. The PMOS 150 has a gate terminal coupled to a PMOS pre-driver circuit 120, and a source terminal coupled to the Vcc terminal. When a positive ESD pulse is applied to the I/O pad 100, the first NMOS transistor 130 and the second NMOS transistor 140 turn on and create an additional current path whereby the current is conducted to the Vss terminal. If a negative ESD pulse is charged to the I/O pad 100, the PMOS 150 will turn on and create an additional path conducting the current from the Vcc.

However, in positive ESD/Vss zapping event, the ESD protection circuit shown in FIG. 1 is more vulnerable to an ESD pulse. The vulnerability of the ESD protection circuit results from the fact that a current crowds at the channel region of the first NMOS 130, so as to disturb the performance of the ESD protection circuit. This phenomenon is called gate voltage-induced current crowding (GVICC) effects.

Therefore, it is desirable to provide a circuit or a method for ESD protection which eliminates or substantially reduces the GVICC effects.

SUMMARY OF THE INVENTION

A sensor for electrostatic discharge (ESD) protection is provided. The sensor comprises a voltage divider and a device. The sensor is coupled to a Vcc1 terminal, wherein a voltage drop occurs across the voltage divider and a high state voltage is generated at an output terminal of the sensor when the Vcc1 terminal is coupled to an ESD voltage pulse. The device is coupled to the voltage divider, wherein the device is adapted to maintain the high state voltage at the output terminal of the sensor, while the Vcc1 terminal is coupled to the ESD voltage pulse.

A circuit for ESD protection is provided. The circuit includes an ESD protection circuit having a metal-oxide-semiconductor (MOS) transistor with a gate terminal therein. A sensor senses an ESD pulse and generates a high state voltage at an output terminal of the sensor in response to the ESD pulse. An inverter coupled to the output terminal of the sensor and the ESD circuit.

A method for ESD protection is provided. The method includes pulling down a gate terminal of a MOS transistor of an ESD circuit to a low state voltage when an ESD pulse is sensed.

DESCRIPTION OF THE PREFERRED EMBODIMENT

Figure 1:
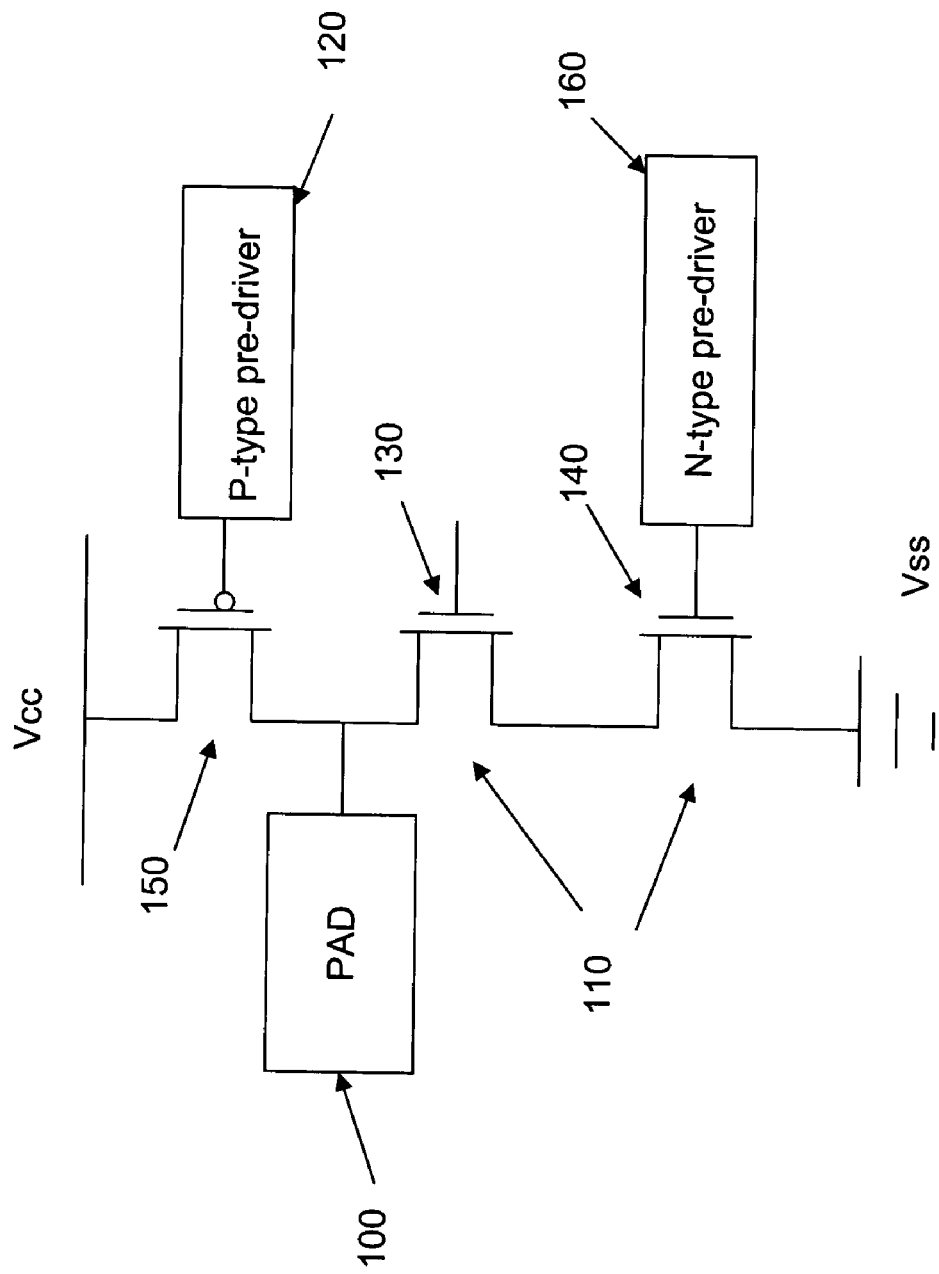
FIG. 1 illustrates a schematic drawing showing a prior art ESD protection circuit.
Figure 2:
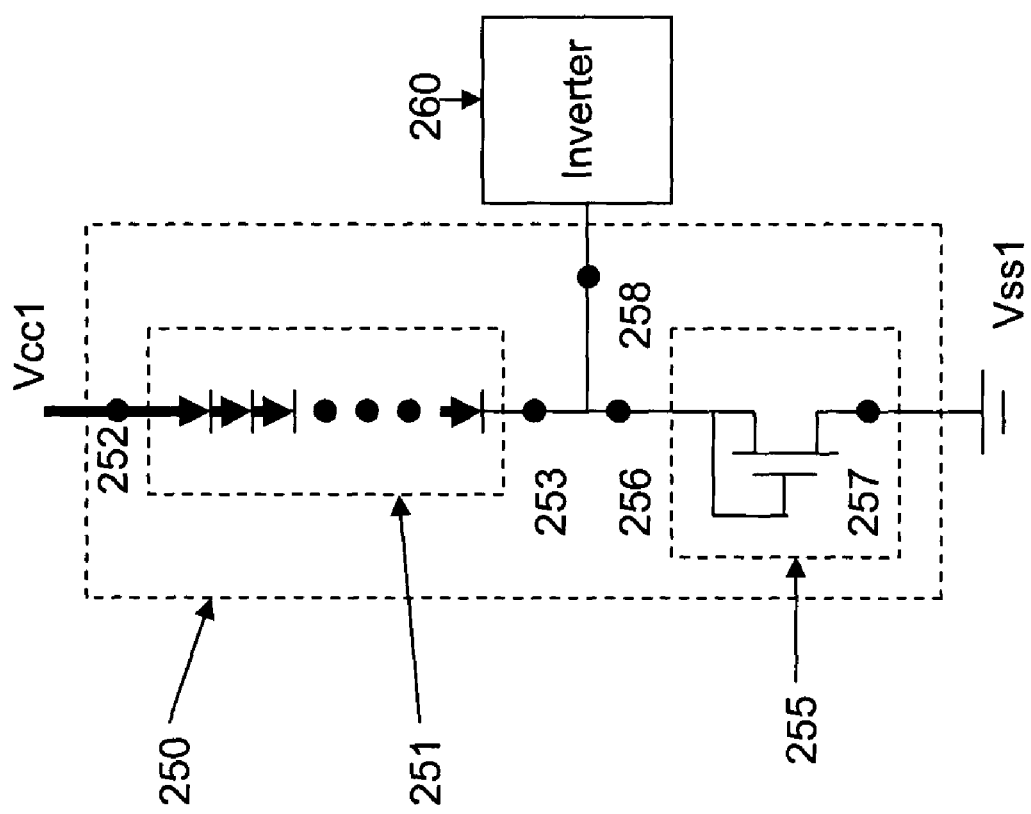
FIG. 2 illustrates a schematic drawing showing an exemplary embodiment of a sensor for ESD protection in accordance with the invention.

FIG. 2 illustrates a sensor for ESD protection according to one embodiment of the invention. The sensor 250 includes a voltage divider 251 and a device 255. The voltage divider 251 is coupled to an input terminal 252 of the sensor 250. In addition, the voltage divider 251 also includes an output terminal 253. In some embodiments, the input terminal 252 of the sensor 250 is coupled to a voltage supply terminal, such as a Vcc1 terminal. The Vcc1 terminal has a voltage, for example, about 3.3V when the internal circuit is under normal operation. The output terminal 253 of the voltage divider 251 is coupled to the first terminal 256 of the device 255 and the output terminal 258 of the sensor 250. The second terminal 257 of the device 255 is coupled to a Vss1 terminal. The Vss1 terminal is, for example, grounded when the internal circuit is under normal operation. The output terminal 258 of the sensor 250 is coupled to an inverter 260. When an ESD voltage pulse is applied to the Vcc1 terminal and coupled to the input terminal 252 of the sensor 250, a voltage drop occurs across the voltage divider 251 and a high state voltage is generated at the output terminal 258 of the sensor 250. The device 255 can maintain the high state voltage at the output terminal 258 of the sensor 250, while the Vcc1 terminal is coupled to the ESD voltage pulse.

The voltage divider 251 can create a voltage drop across the voltage divider 251. Moreover, when an ESD voltage pulse is applied to the Vcc1 terminal and coupled to the input terminal 252 of the sensor 250, a high state voltage is generated at the output terminal 258 of the sensor 250; whereas when the Vcc1 terminal is under normal operation, a low state voltage is generated at the output terminal 258 of the senor 250. The high or low state voltage means, for example, that the voltage can turn on or off a transistor. The voltage divider 251 can be, for example, a series of diodes, a resistor, transistors or any other equivalent circuits that can substantially perform the same function of the voltage divider 251. In some embodiments, if the voltage divider 251 is a series of diodes, the number of the diodes depends on the operation voltage of the Vcc1 terminal. If the voltage of the Vcc1 terminal is 3.3V, the series of diodes may have about 6 diodes. When the voltage of the Vcc1 terminal is 2.5V, the series of the diodes has about 5 diodes. Accordingly, one of ordinary skill will understand that a desirable diode number for the voltage divider 251 depends on the operation voltage of the Vcc1 terminal. In some embodiments, the series of diodes can have, for example, about 3 to about 8 diodes.

The device 255 is adapted to maintain the high state voltage at the output terminal 258 of the sensor 250 when an ESD voltage pulse is applied to the Vcc1 terminal and to maintain the low state voltage at the output terminal 258 of the sensor 250 when the Vcc1 terminal is under normal operation. For example, if the voltage on Vcc1 terminal is 3.3V under normal operation, the voltage divider 251 drops the voltage 3.3V at the input terminal 252 of the sensor 250 to, for example, zero voltage or a low state voltage at the output terminal 253 of the voltage divider 251. Then the device 255 maintains the zero voltage or the low state voltage at the output terminal 258 of the sensor 250.

The device 255 can be, for example, a NMOS, PMOS, CMOS transistor, p/n junction diodes or any other equivalent circuits that can substantially perform the same function of the device 255. In those embodiments which use a NMOS transistor to perform the function of the device 225, the gate terminal and drain terminal of the NMOS transistor can be common.

Figure 3:
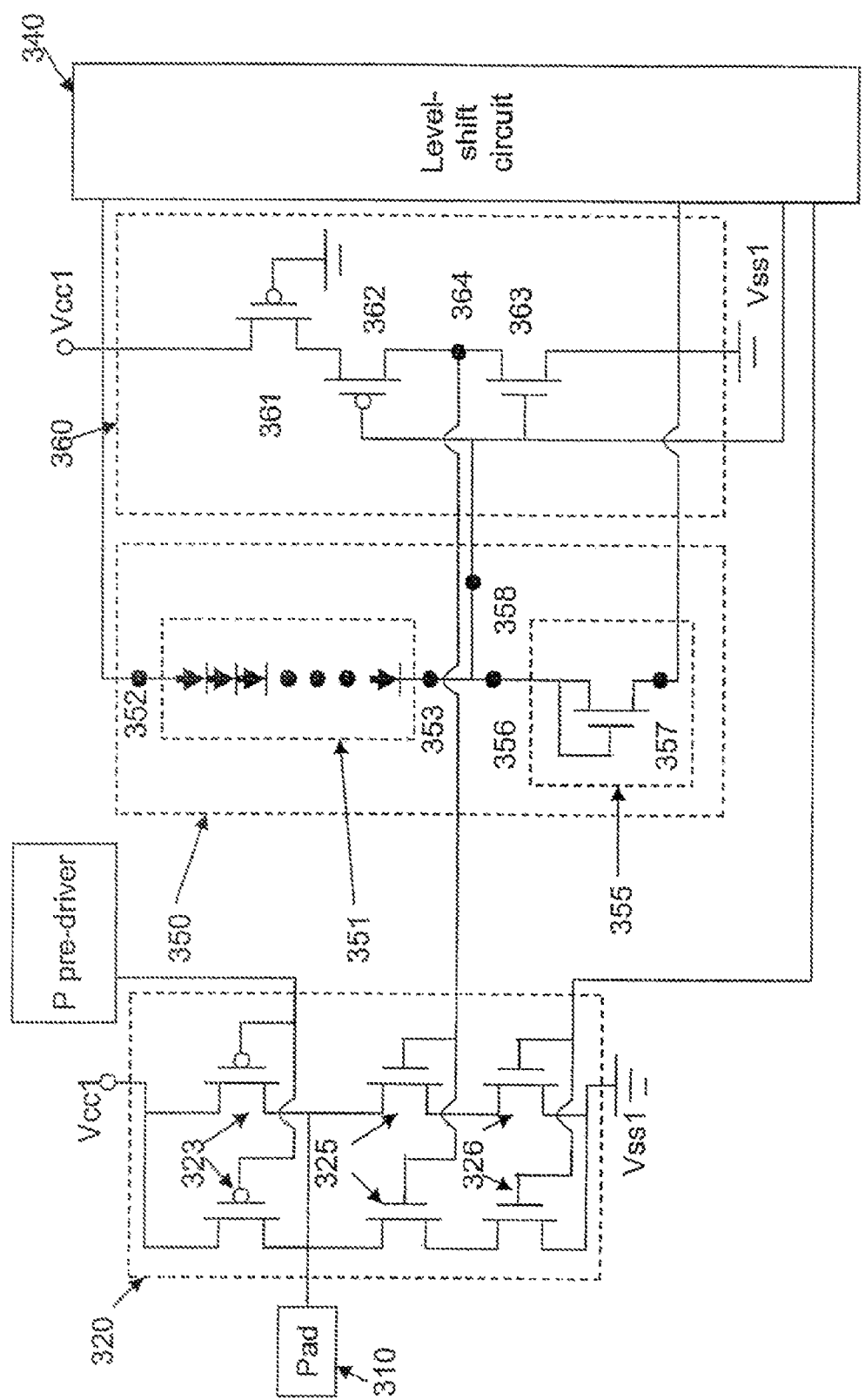
FIG. 3 illustrates a schematic drawing illustrating an exemplary of one embodiment of a circuit for ESD protection in accordance with the invention.

FIG. 3 illustrates a schematic drawing of an exemplary circuit for ESD protection. The circuit includes a pad 310, an ESD protection circuit 320, a sensor 350, an inverter 360, and a level-shift circuit 340. Items of the sensor 350 in FIG. 3 which are the same items of the sensor 250 in FIG. 2 are identified by reference numerals that are increased by 100. Detailed descriptions of these items are not repeated.

The pad 310 can be, for example a power input/output (I/O) pad, or a signal input/output (I/O) pad. The pad 310 is coupled to the ESD protection circuit 320. The ESD protection circuit 320 can be a stacked NMOS (ST NMOS) type, gate ground NMOS (GGNMOS) type or any other ESD protection circuits. In some embodiments utilizing the ST NMOS type ESD protection circuit to discharge ESD pulses, the ESD protection circuit 320 includes some P-type MOS (PMOS) transistors 323 and NMOS transistors 325 and 326. The PMOS transistors 323 are connected in parallel for each other. Each drain terminal of the PMOS transistors 323 is coupled to the pad 310, and each source terminal of the PMOS transistors 323 is coupled to the Vcc1 terminal. Each gate terminal of the PMOS transistors 323 is coupled to a PMOS pre-driver circuit.

The NMOS transistors 325 and 326 are connected in series. In some embodiments, the NMOS transistor 325 is a cascaded NMOS transistor, and the series NMOS transistors 325 and 326 are called a ST MOS. Each drain terminal of the NMOS transistors 325 is coupled to the pad 310, and each source terminal of the NMOS transistors 326 is coupled to a Vss1 terminal. Each gate terminal of the NMOS transistors 325 is connected to an output terminal 364 of the inverter 360. Each gate terminal of the NMOS transistors 326 is connected to a level-shift circuit 340. For some embodiments, the numbers of NMOS transistors 325 and 326 and PMOS transistors 323 are more than, or equal to, 1.

The inverter 360 can be a NMOS inverter, PMOS inverter, complementary MOS (CMOS) inverter or the like. In some embodiments, if a CMOS inverter is chosen to perform the function of the inverter 360, the inverter 360 can include two PMOS transistors 361 and 362, and a NMOS transistor 363 connected in series. A source terminal of the PMOS transistor 361 is coupled to the Vcc1 terminal. A drain terminal of the PMOS transistor 362 is connected to the output terminal 364 of the inverter 360 and a drain terminal of the NMOS transistor 363. A source terminal of the NMOS transistor 363 is coupled to the Vss1 terminal. A gate terminal of the PMOS transistor 361 is coupled to ground. The gate terminals of the PMOS transistor 362 and the NMOS transistor 363 are connected to the level-shift circuit 340 as well as the output terminal 358 of the sensor 350. In these embodiments, there is no specific requirement regarding the number of PMOS transistors that are used in the inverter 360. One of ordinary skill in the art will know that the number of the PMOS transistor depends on the performance of type of the I/O circuit and decide the number of the PMOS transistor.

The components of the sensor 350 in FIG. 3 are the same as those of the sensor 250 in FIG. 2, identified by reference numerals that are increased by 100. The voltage divider 351 is adapted to create a voltage drop thereacross. Moreover, when an ESD voltage pulse is applied to the Vcc1 terminal, a high state voltage is generated at the output terminal 358 of the senor 350; whereas, when the Vcc1 terminal is under normal operation, a low state voltage is generated at the output terminal 358 of the senor 350. The device 355 is adapted to maintain the high state voltage at the output terminal 358 of the sensor 350, while the ESD voltage pulse is applied to the Vcc1 terminal and to maintain the low state voltage at the output terminal 358 of the sensor 350 while the Vcc1 terminal is under normal operation. Detailed descriptions of each item are not repeated.

The level-shift circuit 340 is adapted to convert a level signal into a higher level signal, such as from 1.8V to 3.3V, in order to provide different voltages for operations of different circuits. The level-shift circuit 340 can be, for example, a feedback PMOS type level-shift circuit or any other circuits that can substantially perform the same function of the level-shift circuit 340.

Under normal operation, i.e. no ESD pulse charged to the pad 310, the Vcc1 terminal is charged to a voltage, for example, 3.3V, and the Vss1 terminal is, for example, grounded. The input terminal 352 of the sensor 350 is coupled to the Vcc1 terminal and the voltage divider 351 completely or substantially drops the voltage of the Vcc1 terminal to a low state voltage, such as zero voltage, when the Vcc1 terminal is under normal operation. By the assistance of the device 355, the output terminal 358 of the sensor 350 can generate an output voltage signal, such as zero voltage or a low voltage that cannot turn on the NMOS transistor 363, but turns on the PMOS transistor 362. Due to the turn-off of the NMOS transistor 363 and the turn-on of the PMOS transistor 362, the voltage of the Vcc1 terminal, i.e. 3.3V, is applied to the output terminal 364 of the inverter 360 and to the gate terminals of the NMOS transistors 325 of the ESD protection circuit 320. Under the same operation condition, the voltage of the gate terminals of the NMOS transistors 326 is pulled down to a low state, such as zero voltage, by the operation of the level-shift circuit 340.

There is no requirement that the output signal generated from the output terminal 358 is zero voltage when the I/O circuit is under normal operation. All that is required is that the output signal be too low to turn on the NMOS transistor 363, but turn off the PMOS transistor 362 of the inverter 360. However, the circuit is more advantageous if the output signal is, or close to, zero voltage. In those embodiments, employing a series of diodes to perform the function of the voltage divider 351, the output signal of the sensor 250 can be controlled by adjusting the number of the diodes. For example, the voltage of the Vcc1 terminal is 3.3V, 6 diodes may be enough completely dropping the voltage of the Vcc1 terminal. When the voltage of the Vcc1 terminal is 2.5V, 5 diodes maybe is enough. Accordingly, in these embodiments, one of ordinary skill in the art can understand how to adjust the diode number, and keep the I/O circuit operate smoothly.

When an ESD pulse is charged to the pad 310, the Vcc1 terminal will be coupled to a higher voltage than under normal operation. The voltage of the Vcc1 terminal can be, for example, more than 8V. Because of the higher voltage of the Vcc1 terminal, the voltage divider 351 can partially drop the high voltage from the Vcc1 terminal, and generate a high state voltage at the second terminal 353. By the assistance of the device 355 to maintain the high state voltage on the second terminal 353, the voltage at the output terminal 358 can turn on the NMOS transistor 363 and turn off the PMOS transistor 362 of the inverter 360. Due to the turn-on of the NMOS transistor 363 and the turn-off of the PMOS transistor 362, the voltage of the Vss1 is charged to the output terminal 364 of the inverter 360 and to the gate terminals of the NMOS transistors 325 of the ESD protection circuit 320. Therefore, the voltage of gate terminals of the NMOS transistors 325 can be pulled down to a low voltage state after an ESD pulse is charged to the pad 310. At the same moment, the voltage of the gate terminals of the NMOS transistors 326 is pulled down to a low state, such as zero voltage, by the operation of the level-shift circuit 340.

There is no requirement how high the voltage of the output signal at the output terminal 358 of the sensor 350 is when the I/O circuit is charged with an ESD pulse. All it needs is that the output signal at the output terminal 358 of the sensor 350 be high enough as to turn on the NMOS transistor 363, and turn off the PMOS transistor 362 of the inverter 360. In those embodiments using diode series to perform the function of the voltage divider 351, the series of diodes cannot completely drop the ESD voltage of the Vcc1 terminal. For example, if the voltage of the Vcc1 terminal is 8V when an ESD pulse is applied thereto, the 6-diode series may drop about 4.8V and the output signal of the sensor 350 is about 3.2V. The remaining voltage 3.2V is high enough to turn on the NMOS transistor 363, and turn off the PMOS transistor 362 of the inverter 360.

Note that there is no requirement that the sensor 350 be separate from the ESD protection circuit 330. However, it would be more advantageous that the sensor 350 is not embedded in the ESD protection circuit 330 because the sensor could be shared by the other I/O circuits. One of ordinary skill in the art can understand that whether the sensor 350 should be embedded in the ESD protection circuit 330 depends on, for example, the performance of the I/O circuit, the size of the ESD protection circuit 330 or the complexity of circuit layout.

By the method or circuit disclosed above, the voltage of the gate terminal of the NMOS transistors 325 of the ESD protection circuit 320 is pulled down after an ESD pulse is sensed. Therefore, the GVICC effects can be efficiently avoided or eliminated.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A circuit for electrostatic discharge (ESD) protection, comprising:
   an ESD protection circuit having a stack of cascaded NMOS transistors configured to discharge an ESD pulse;
   a sensor that senses the ESD pulse and generates a high state voltage at an output terminal of the sensor in response to the ESD pulse; and
   an inverter coupled to the output terminal of the sensor and the ESD circuit, wherein the sensor applies the high state voltage to an input terminal of the inverter,
   wherein an input to the stack of cascaded NMOS transistors of the ESD protection circuit is pulled down to a low state voltage by an output voltage of the inverter when the sensor senses the ESD pulse.

2. The circuit of claim 1, wherein the sensor comprises:
   a voltage drop circuit coupled to the input terminal of the sensor, wherein a voltage drop occurs across the voltage drop circuit and the high state voltage is generated at the output terminal of the sensor when the input terminal of the sensor is coupled to a voltage generated by the ESD pulse; and
   a device coupled to the voltage drop circuit, wherein the device is adapted to maintain the high state voltage at the output terminal, while the input terminal of the sensor is coupled to the ESD voltage pulse.

3. The circuit of claim 2, wherein the input terminal of the sensor is coupled to a voltage supply terminal.

4. The circuit of claim 2, wherein the voltage drop circuit comprises a series of diodes.

5. The circuit of claim 4, wherein the series of diodes has about 3 to about 8 diodes.

6. The circuit of claim 2, wherein the device comprises a metal-oxide-semiconductor (MOS) transistor.

7. The circuit of claim 6, wherein the MOS transistor of the device is a N-type MOS (NMOS) transistor.

8. The circuit of claim 7, wherein a gate terminal and a drain terminal of the NMOS transistor of the device are common.

* * * * *

UNITED STATES PATENT AND TRADEMARK OFFICE
CERTIFICATE OF CORRECTION

PATENT NO. : 7,583,484 B2  Page 1 of 1
APPLICATION NO. : 10/644718
DATED : September 1, 2009
INVENTOR(S) : Yi-Hsun Wu and Jian-Hsing Lee It is certified that error appears in the above-identified patent and that said Letters Patent is hereby corrected as shown below:

Column 1, line 50, delete "ESDIVss" and replace therefor --ESD/Vss--

Signed and Sealed this

Twenty-third Day of March, 2010

David J. Kappos
*Director of the United States Patent and Trademark Office*